United States Patent
Arikawa et al.

(10) Patent No.: US 12,010,554 B2
(45) Date of Patent: Jun. 11, 2024

(54) SCHEDULING SYSTEM AND METHOD

(71) Applicant: Nippon Telegraph and Telephone Corporation, Tokyo (JP)

(72) Inventors: Yuki Arikawa, Tokyo (JP); Takeshi Sakamoto, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 415 days.

(21) Appl. No.: 17/298,991

(22) PCT Filed: Dec. 13, 2019

(86) PCT No.: PCT/JP2019/048933
§ 371 (c)(1),
(2) Date: Jun. 2, 2021

(87) PCT Pub. No.: WO2020/137619
PCT Pub. Date: Jul. 2, 2020

(65) Prior Publication Data
US 2022/0030466 A1  Jan. 27, 2022

(30) Foreign Application Priority Data
Dec. 26, 2018 (JP) .................. 2018-242281

(51) Int. Cl.
H04W 28/16 (2009.01)
H04W 72/12 (2023.01)

(52) U.S. Cl.
CPC ........... *H04W 28/16* (2013.01); *H04W 72/12* (2013.01)

(58) Field of Classification Search
None
See application file for complete search history.

(56) References Cited

U.S. PATENT DOCUMENTS 9,350,478 B2   5/2016  Shimezawa et al.
9,398,489 B1 * 7/2016  Akhter ................... H04L 69/04
(Continued)

FOREIGN PATENT DOCUMENTS

JP   2012135051 A   7/2012
JP   2015089028 A   5/2015
(Continued)

OTHER PUBLICATIONS

Arikawa et al, "Hardware Accelerator for Coordinated Radio-Resource Scheduling in 5G Ultra-High-density Distributed Antenna Systems," 27th International Telecommunication Networks and Applications Conference (ITNAC), IEEE, 2017, 6 pages.
(Continued)

*Primary Examiner* — Christopher T Wyllie
(74) *Attorney, Agent, or Firm* — Slater Matsil, LLP

(57) ABSTRACT

In a scheduling calculation unit, a setting parameter value, such as channel information, can be set in a short time period. A scheduling system includes: a transfer source process unit that compresses M-bit information (M is an integer of two or more) obtained from user equipment, to N bits (N<M, N is an integer of one or more); a transfer destination process unit that expands N-bit information transmitted from the transfer source process unit, or N-bit information read from the transfer source process unit, to L bits (L>N, L is an integer of two or more), and stores the expanded information; and a scheduling calculation unit that identifies an optimal combination pattern between a transmission point and the user equipment, using L-bit information stored in the transfer destination process unit.

13 Claims, 11 Drawing Sheets

(56) References Cited

U.S. PATENT DOCUMENTS

| | | | |
|---|---|---|---|
| 9,703,603 B1* | 7/2017 | Roy | G06F 9/3877 |
| 10,599,441 B2* | 3/2020 | Basher | G06F 9/5077 |
| 11,042,413 B1* | 6/2021 | Byagowi | G06F 9/5027 |
| 11,042,414 B1* | 6/2021 | Byagowi | G06F 9/505 |
| 2012/0243468 A1* | 9/2012 | Hui | H04B 7/024 |
| | | | 370/328 |
| 2012/0329502 A1* | 12/2012 | Frederiksen | H04L 1/0026 |
| | | | 455/509 |
| 2014/0282560 A1* | 9/2014 | Hutton | G06F 9/5055 |
| | | | 718/102 |
| 2015/0078321 A1* | 3/2015 | Zhang | H04L 5/0035 |
| | | | 370/329 |
| 2016/0269940 A1 | 9/2016 | Takeda et al. | |
| 2017/0329647 A1* | 11/2017 | Eda | G06F 3/061 |
| 2018/0027062 A1* | 1/2018 | Bernat | G06F 1/183 |
| 2018/0059939 A1* | 3/2018 | He | G06F 3/0659 |
| 2018/0242337 A1* | 8/2018 | Arikawa | H04W 72/12 |
| 2022/0030466 A1* | 1/2022 | Arikawa | H04W 72/12 |
| 2022/0067527 A1* | 3/2022 | Xu | G06N 3/063 |
| 2023/0171836 A1* | 6/2023 | Butt | H04W 76/19 |
| | | | 370/216 |

FOREIGN PATENT DOCUMENTS

| | | |
|---|---|---|
| JP | 2016103848 A | 6/2016 |
| JP | 2018201140 A | 12/2018 |

OTHER PUBLICATIONS

Taoka et al.. "MIMO and Inter-Cell Cooperative Transmission and Reception Technology in LTE—Advanced," LTE—Advanced MIMO, Technology Report, Technical Journal, vol. 18, No. 2, pp. 22-30.

* cited by examiner

Fig. 2

| THRESHOLD TH1<br>(M-BIT TRANSMISSION DATA) | OUTPUT VALUE DO1<br>(N-BIT QUANTIZED DATA, N=4) |
|---|---|
| -3.5 | 0 |
| -2.0 | 1 |
| 0.4 | 2 |
| ⋮ | ⋮ |
| 12.4 | 15 |

| INPUT VALUE DO1 (N-BIT QUANTIZED DATA, N=4) | OUTPUT VALUE DO2 (L-BIT RECEIVED DATA) |
|---|---|
| 0 | -3.5 |
| 1 | -2.0 |
| 2 | 0.4 |
| ⋮ | ⋮ |
| 15 | 12.4 |

310

SCHEDULING SYSTEM AND METHOD

CROSS-REFERENCE TO RELATED APPLICATIONS

This application is a national phase entry of PCT Application No. PCT/JP2019/048933, filed on Dec. 13, 2019, which claims priority to Japanese Application No. 2018-242281, filed on Dec. 26, 2018, which applications are hereby incorporated herein by reference.

TECHNICAL FIELD

The present invention relates to a wireless network control technology, and particularly, to a scheduling system and method for allocating radio resources that a wireless network has, by designating operation details (transmission states) of each transmission point in the wireless network.

BACKGROUND

Along with the popularization of smartphones, social demands for wireless networks, such as improvement in communication rate and increase in use bandwidth, have been growing. Against such a backdrop, a wireless network system to which radio interface specifications according to a mobile communication scheme called LTE (Long Term Evolution) are applied has been widely spreading. According to LTE, coordinated multi-point transmission/reception (hereinafter, abbreviated as CoMP) between cells is adopted as one of radio access technologies. In CoMP, multiple base stations (Transmission Points in a wireless network system: hereinafter, abbreviated as TPs) coordinate with each other to transmit and receive signals to and from user equipment (mobile terminals in the wireless network system: User Equipment; hereinafter abbreviated as UE) (see Non-Patent Literature 1).

The CoMP technology is one of important technologies that improve the frequency use efficiency and the cell edge user throughput. For example, in downlink communication (transmission from TP to UE), multiple TPs simultaneously perform transmission to each piece of UE using the same frequency band, thereby allowing the use efficiency of radio resources to be improved. However, if TPs perform transmission to different pieces of UE, signals from the other TPs interfere with a desired reception signal with respect to UE capable of receiving signals from multiple TPs; unfortunately, the interference possibly reduces the throughput. Accordingly, to suppress such interference while improving the communication rate, CoMP is an indispensable technology.

Furthermore, a next generation mobile communication scheme evolved from LTE has been researched and developed. A coordinated radio resource control scheme as a concept extended from CoMP, and a dedicated hardware configuration for improving the rate of the process thereof has been proposed (see Non-Patent Literature 2). Likewise, Patent Literature 1 describes a circuit configuration that processes matrix calculation in parallel, in order to improve the rate of the process of coordinated radio resource control scheme.

FIG. 12 is a block diagram showing a configuration of a conventional scheduling system disclosed in Patent Literature 1. The scheduling system includes: a scheduling calculation unit 201 that identifies the optimal combination pattern of TP and UE using information (channel information indicating a radio wave state obtained from UE) stored in a transfer destination process unit 203; a transfer source process unit 202 that transmits, to the transfer destination process unit 203, the channel information obtained from UE; and the transfer destination process unit 203 that stores the channel information transmitted from the transfer source process unit 2. The transfer source process unit 202 includes a memory 204 that stores the channel information, and a transmission unit 205 that transmits the channel information. The transfer destination process unit 203 includes a reception unit 206 that receives the channel information, and a memory 207 that stores the channel information.

When control is performed using the coordinated radio resource control scheme in the wireless network system, the process thereof is required to be completed in a cycle (e.g., about one millisecond to sub-milliseconds) defined by the wireless network system. The process of the coordinated radio resource control scheme uses the channel information indicating the radio wave state. Unfortunately, this requires a long time period for obtaining an external setting parameter, such as the channel information, causing a problem in that scheduling calculation for identifying the combination between TPs and pieces of UE requires time. In the example in FIG. 12, transmission of the channel information from the transfer source process unit 202 to the transfer destination process unit 203 requires time, and the scheduling calculation requires time accordingly.

CITATION LIST

Patent Literature

Patent Literature 1: Japanese Patent Laid-Open No. 2018-085682

Non-Patent Literature

Non-Patent Literature 1: Taoka et al., "MIMO and coordinated multi-point transmission/reception between cells in LTE-Advanced", NTT DOCOMO Technical Journal, Vol. 18, No. 2, pp. 22-30, July 2010, <https://www.nttdocomo.co.jp/binary/pdf/corporate/technology/rd/technical_journal/bn/vol 18_2/vol18_2_022jp.pdf>

Non-Patent Literature 2: Y. Arikawa, T. Sakamoto and S. Kimura, "Hardware accelerator for coordinated radio-resource scheduling in 5G ultra-high-density distributed antenna systems", 2017 27th International Telecommunication Networks and Applications Conference (ITNAC), Melbourne, pp. 1-6, November 2017

SUMMARY

Technical Problem

Embodiments of the present invention are for solving the problems as described above, and has an object to provide a scheduling system and a method that can set an external setting parameter value, such as channel information, in a short time period, in the scheduling calculation unit, in order to improve the rate of the process of the coordinated radio resource control scheme in the wireless network system.

Means for Solving the Problem

Embodiments of the present invention include a scheduling system allocating a radio resource held by a plurality of transmission points to radio communication between the transmission points and user equipment, in a wireless network system including the transmission points, the scheduling system including: a transfer source process unit that compresses M-bit information (M is an integer of two or more) obtained from the user equipment, to N bits (N<M, N is an integer of one or more); a transfer destination process unit that expands N-bit information transmitted from the transfer source process unit, or N-bit information read from the transfer source process unit, to L bits (L>N, L is an integer of two or more), and stores the expanded information; and a scheduling calculation unit that identifies an optimal combination pattern between the transmission points and the user equipment, using L-bit information stored in the transfer destination process unit.

In one configuration example of the scheduling system of embodiments of the present invention, the transfer source process unit adds an ID of the user equipment to the N-bit information on one transmission point and one piece of user equipment, and the transfer source process unit transmits, to the transfer destination process unit, the N-bit information to which the ID of the user equipment is added, or the transfer destination process unit reads, from the transfer source process unit, the N-bit information to which the ID of the user equipment is added.

In one configuration example of the scheduling system of embodiments of the present invention, when a plurality of pieces of the user equipment having an identical value of the N-bit information on one transmission point are present, the transfer source process unit adds flag information where bit flags corresponding to the pieces of user equipment are set, to the N-bit information, and the transfer source process unit transmits, to the transfer destination process unit, the N-bit information to which the flag information is added, or the transfer destination process unit reads, from the transfer source process unit, the N-bit information to which the flag information is added.

In one configuration example of the scheduling system of embodiments of the present invention, when a plurality of pieces of the user equipment having an identical value of the N-bit information on one transmission point are present, the transfer source process unit adds IDs of the pieces of user equipment to the N-bit information, and transmits, to the transfer destination process unit, the N-bit information to which the IDs of the pieces of user equipment are added, or the transfer destination process unit reads, from the transfer source process unit, the N-bit information to which the IDs of the pieces of user equipment are added.

In one configuration example of the scheduling system of embodiments of the present invention, when there are a plurality of combinations between the transmission points and the pieces of user equipment corresponding to an identical value of the N-bit information, the transfer source process unit adds the combination of IDs of the transmission points and IDs of the pieces of user equipment, to the N-bit information, with respect to each of the combinations, and the transfer source process unit transmits, to the transfer destination process unit, the N-bit information to which the combinations of the IDs of the transmission points and the IDs of the pieces of user equipment are added, or the transfer destination process unit reads, from the transfer source process unit, the N-bit information to which the combinations of the IDs of the transmission points and the IDs of the pieces of user equipment are added.

In one configuration example of the scheduling system of embodiments of the present invention, the transfer source process unit is implemented in a computer, and the transfer destination process unit and the scheduling calculation unit are implemented in an FPGA connected to the computer.

In one configuration example of the scheduling system of embodiments of the present invention, the M-bit information obtained from the user equipment is channel information representing a radio wave state.

Embodiments of the present invention include a scheduling method allocating a radio resource held by a plurality of transmission points to radio communication between the transmission points and user equipment, in a wireless network system including the transmission points, the scheduling method including: a first step of a transfer source process unit compressing M-bit information (M is an integer of two or more) obtained from the user equipment, to N bits (N<M, N is an integer of one or more); a second step of the transfer source process unit transmitting the N-bit information to a transfer destination process unit, or of the transfer destination process unit reading the N-bit information from the transfer source process unit; a third step of the transfer destination process unit expanding N-bit information transmitted from the transfer source process unit, or N-bit information read from the transfer source process unit, to L bits (L>N, L is an integer of two or more); a fourth step of the transfer destination process unit storing the L-bit information; and a fifth step of a scheduling calculation unit identifying an optimal combination pattern between the transmission points and the user equipment, using L-bit information stored in the transfer destination process unit.

Effects of Embodiments of the Invention

According to embodiments of the present invention, the transfer source process unit, which holds the information obtained from the user equipment, compresses the obtained M-bit information to N bits and subsequently transmits the compressed information to the transfer destination process unit that includes the memory accessible from the scheduling calculation unit at high speed. Alternatively, the transfer destination process unit reads information from the transfer source process unit. The transfer destination process unit expands, to L bits, the information compressed to N bits. At a time when setting of all the setting parameters required to start the operation of the scheduling calculation unit is completed, the scheduling calculation unit starts the scheduling calculation. Accordingly, in comparison with a case where the M-bit information obtained from the user equipment is not compressed, embodiments of the present invention can reduce the amount of transfer data between the transfer source process unit and the transfer destination process unit, and reduce the time period required for scheduling calculation.

Furthermore, in embodiments of the present invention, when a plurality of pieces of the user equipment having an identical value of the N-bit information on one transmission point are present, flag information where bit flags corresponding to the pieces of user equipment are set is added to the N-bit information. Accordingly, in embodiments of the present invention, one data transmission or one data reading can transmit or read a plurality of combinations of the transmission points and the pieces of user equipment corresponding to the identical channel information. In embodiments of the present invention, in comparison with a case where the M-bit information obtained from the user equipment is not compressed, the amount of transfer data between the transfer source process unit and the transfer destination process unit can be reduced.

In embodiments of the present invention, when a plurality of pieces of the user equipment having an identical value of the N-bit information on one transmission point are present, IDs of the pieces of user equipment are added to the N-bit information. Accordingly, in embodiments of the present invention, the data format is a variable-length one. Consequently, even if the number of combinations between the transmission points and the pieces of user equipment corresponding to the identical channel information temporarily increases, the information obtained from the user equipment can be transmitted at one time or read at one time.

According to embodiments of the present invention, when there are a plurality of combinations between the transmission points and the pieces of user equipment corresponding to an identical value of the N-bit information, the transfer source process unit adds the combination of IDs of the transmission points and IDs of the pieces of user equipment, to the N-bit information, with respect to each of the combinations. Accordingly, in embodiments of the present invention, the data format is a variable-length one. Consequently, even if the number of combinations between the transmission points and the pieces of user equipment corresponding to the identical channel information temporarily increases, the information obtained from the user equipment can be transmitted at one time or read at one time.

BRIEF DESCRIPTION OF THE DRAWINGS

FIG. 2 illustrates a process of a data conversion unit in a transfer source process unit in the scheduling system according to the first embodiment of the present invention.

DETAILED DESCRIPTION OF ILLUSTRATIVE EMBODIMENTS

Next, embodiments of the present invention are described with reference to the drawings.

Configuration of First Embodiment

Figure 1:
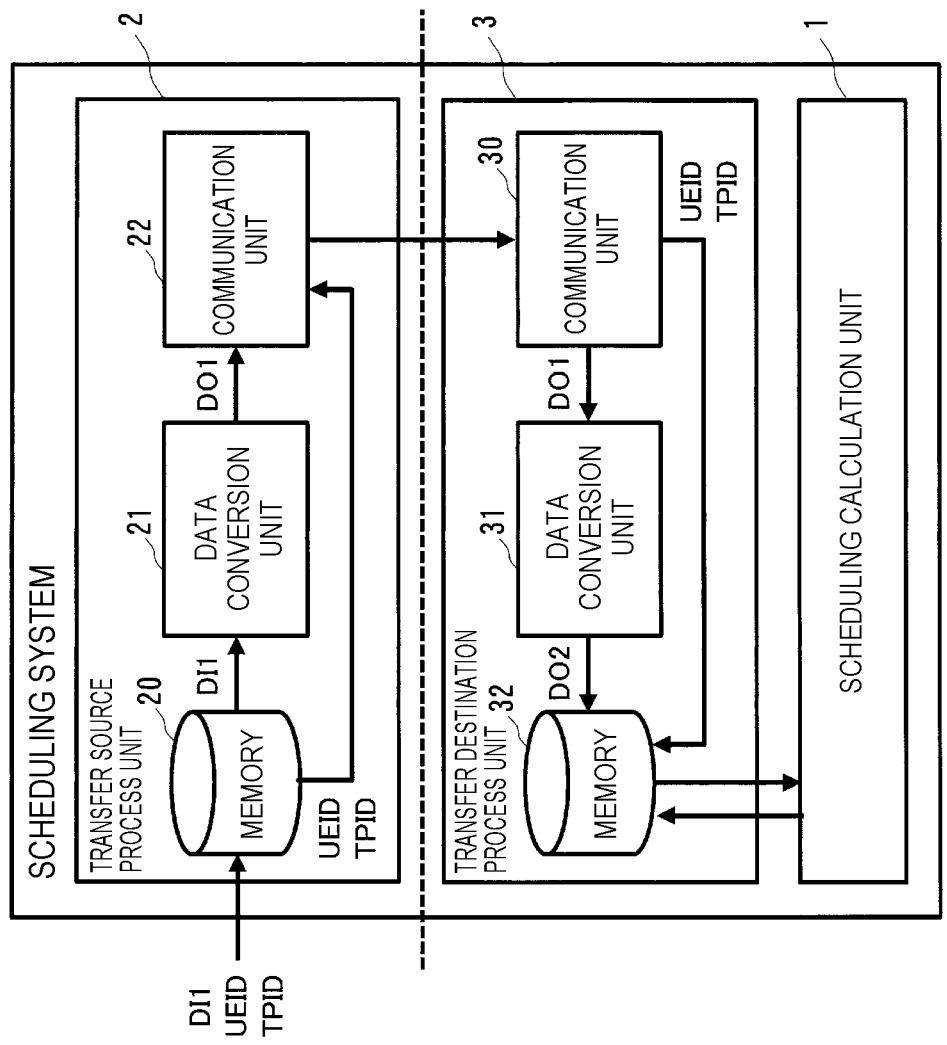
FIG. 1 is a block diagram showing a configuration of a scheduling system according to a first embodiment of the present invention.
Figure 3:
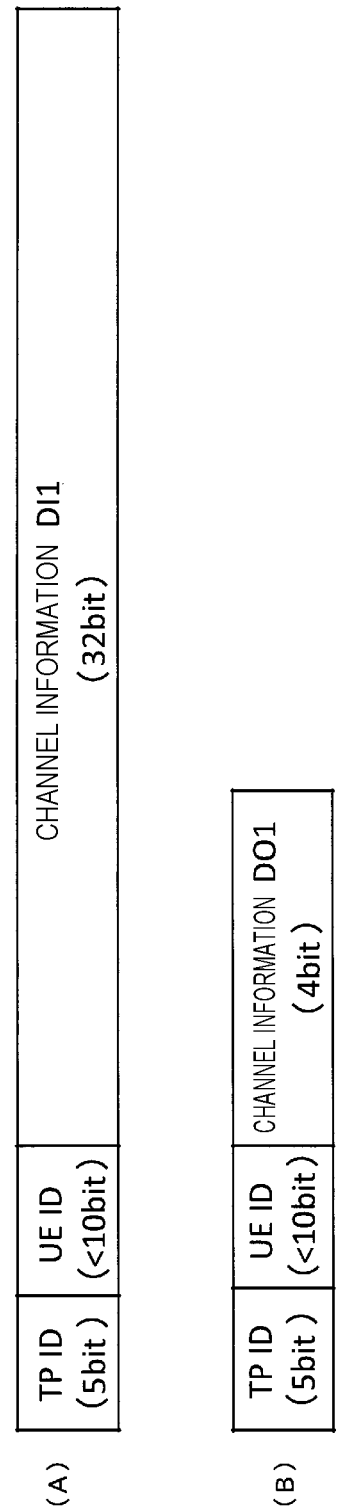
FIG. 3 illustrates data formats used between the transfer source process unit and a transfer destination process unit in the scheduling system according to the first embodiment of the present invention.
Figures 4, 5:
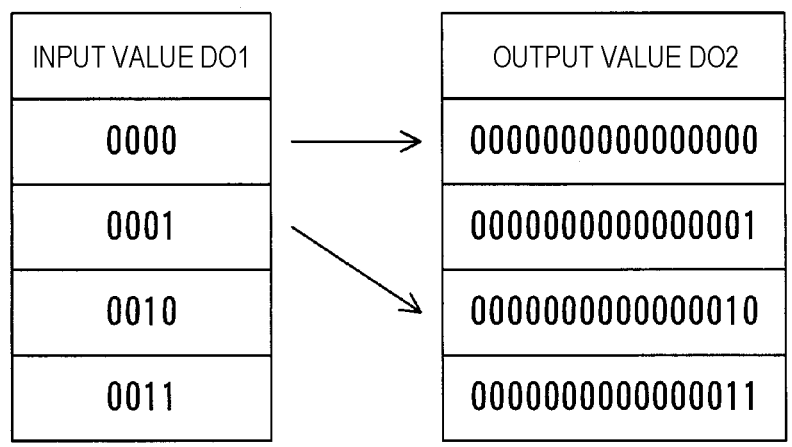
FIG. 4 illustrates a process of the data conversion unit in the transfer destination process unit in the scheduling system according to the first embodiment of the present invention.
FIG. 5 illustrates a process of the data conversion unit in the transfer destination process unit in the scheduling system according to the first embodiment of the present invention.

First, referring to FIGS. 1 to 4, the configuration of a scheduling system according to a first embodiment of the present invention is described. FIG. 1 is a block diagram showing the configuration of the scheduling system according to the first embodiment of the present invention. FIG. 2 illustrates a process of a data conversion unit in a transfer source process unit in the scheduling system according to the first embodiment. FIGS. 3(A) and 3(B) illustrate data formats used between the transfer source process unit and a transfer destination process unit in the scheduling system according to the first embodiment. FIG. 4 illustrates a process of a data conversion unit in the transfer destination process unit in the scheduling system according to the first embodiment.

The scheduling system retrieves, from among the following combination patterns, the optimal combination pattern to be used when a radio resource used to perform radio communication between multiple TPs and UE is allocated to the wireless network that includes the TPs. The following combination patterns are combination patterns between TPs and the transmission states of these TPs (transmission stop or UE) (combinations between TPs and UE).

The scheduling system calculates evaluation values of combination patterns serving as candidates of connection between TPs and UE, in order to determine UE serving as transmission destinations of each of the TPs. The scheduling system repeats a trial of calculating the evaluation value in a scheduling cycle, and adopts the optimal combination pattern having the maximum evaluation value when the scheduling time period elapses, as the combination pattern to be used for actual transmission. Note that the scheduling time period is a time period that can be spent for a process of identifying the combination pattern between TPs and UE, and is determined by the system. For example, in the case of LTE, the scheduling time period is one millisecond at the minimum. Accordingly, the scheduling system identifies the combination pattern between TPs and UE on a one-millisecond cycle.

The scheduling system of this embodiment includes a scheduling calculation unit 1, a transfer source process unit 2, and a transfer destination process unit 3. Here, the scheduling calculation unit 1 identifies the optimal combination pattern of TPs and UE using information (channel information representing the radio wave state obtained from UE) stored in the transfer destination process unit 3. The transfer source process unit 2 compresses M-bit information (M is an integer of two or more) obtained from UE, to N bits (N<M, N is an integer of one or more). The transfer destination process unit 3 expands the N-bit information transmitted from the transfer source process unit 2, or the N-bit information read from the transfer source process unit 2, to L bits (L>N, L is an integer of two or more), and stores the expanded information.

A memory element accessible from the scheduling calculation unit 1 at high speed is, for example, a cache in a case where the scheduling calculation unit 1 is implemented with a CPU, and is an internal memory, register or the like in a case where the scheduling calculation unit 1 is implemented with an FPGA (Field Programmable Gate Array).

The transfer source process unit 2 includes a memory 20, a data conversion unit 21, and a communication unit 22. Here, the memory 20 stores M-bit information DI1 including setting parameters, such as channel information, obtained from UE. The data conversion unit 21 compresses (quantizes) the M-bit information DI1 to N bits. The communication unit 22 transmits N-bit information DO1 compressed by the data conversion unit 21 to the transfer destination process unit 3 according to a predetermined communication scheme. Here, the predetermined communication scheme is Ethernet®, PCIe (PCI Express), etc.

The data conversion unit 21 of the transfer source process unit 2 has a function of quantizing the M-bit information DI1 to N bits (N<M, N is an integer of one or more) using a conversion table 210, as in FIG. 2, storing a threshold TH1, and an N-bit output value DO1 corresponding to the threshold TH1. In a case of N=4, to quantize the M-bit information DI1 to any one value among 2^4=16 values, a 16-stage conversion table 210 is preliminarily prepared that stores thresholds TH1, and N-bit output values DO1 corresponding to the respective thresholds TH1.

The thresholds TH1 stored in the conversion table 210 are arranged in a descending order or an ascending order. The data conversion unit 21 sequentially compares the M-bit information DI with the thresholds TH1 arranged in the descending order or the ascending order, and outputs, as compressed N-bit information, the N-bit output value DO1 stored in association with the threshold TH1 varying in magnitude relationship with the information DI.

The communication unit 22 of the transfer source process unit 2 has a function of converting N-bit information DO1 compressed by the data conversion unit 21 to data in a predetermined format, and transmitting the data to the transfer destination process unit 3 according to a predetermined communication scheme. Here, the channel information obtained from UE is TP-specific channel information on the UE. Accordingly, as shown in FIG. 3(A), the channel information DI1 is a pair of data items that are identification information on TP (TPID), and identification information on UE (UEID). These TPID and UEID are stored, together with the channel information DI, in the memory 20.

The communication unit 22 converts a set of data items that include the N-bit information DO1 compressed by the data conversion unit 21, and the TPID and UEID corresponding thereto, into data in the predetermined format (FIG. 3(B)). In this embodiment, when information DI with TPID=32, UEID=512 and M=32 bits is transmitted to the transfer destination process unit 3, the information DI with M=32 bits is compressed to four-bit information DO1. Accordingly, the number of data items is unchanged, but the entire amount of data to be transmitted can be reduced.

Note that the example described above indicates an example where TPID, UEID and information DO1 are dealt with as one set. However, the data format is not limited thereto. For example, instead of TPID and UEID, the address in a memory 32 of the transfer destination process unit 3 may be added to the N-bit information DO1 to identify the destination of the information DO1. In this case, the address in the memory 32 corresponding to TPID and UEID are predetermined. If channel information is present in each frequency band (sub-band), information indicating the frequency band, besides TPID and UEID, may be added to the information DO1 in some cases.

The transfer destination process unit 3 includes: a communication unit 30 that receives information transmitted from the transfer source process unit 2 according to the predetermined communication scheme; a data conversion unit 31 that expands the N-bit information to L bits; and the memory 32 that stores the information expanded to L bits.

The communication unit 30 of the transfer destination process unit 3 receives the data transmitted from the transfer source process unit 2 according to the predetermined communication scheme, and passes the N-bit information DO1 included in the received data, to the data conversion unit 31.

The data conversion unit 31 of the transfer destination process unit 3 has a function of expanding the N-bit information DO1 input from the communication unit 30, to L bits, using a conversion table 310, as shown in FIG. 4, which stores an input value DO1, and an L-bit output value DO2 (L>N, L is an integer of two or more) corresponding to the input value DO1. In a case of N=4, the information DO1 is classified into 2∝=16, a 16-stage conversion table 310 that stores the input value DO1 and the output value DO2 is preliminarily prepared.

Note that as shown in FIG. 5, if the M-bit information DI1 is quantized to N=4 bits and expanded to L=16 bits, the output value DO2 corresponding to the input value DO1 "0001" is not "0000000000000001" but "000000000000010", for example. As described above, there is a value to which no corresponding input value DO1 is assigned, among values of L=16 bits.

Such correspondence relationship between the input value DO1 and the output value DO2 is stored in the conversion table 310, thereby allowing the information expanded from N=4 bits to be correctly dealt with even when the scheduling calculation unit 1 performs a process with 16 bits. If the scheduling calculation unit 1 correctly grasps the relationship between the M-bit information DI and the N-bit information DO1, and the relationship between the N-bit information DO1 and the L-bit information DO2, this unit can support compression and expansion of data by the transfer source process unit 2 and the transfer destination process unit 3.

Note that the example described above exemplifies data setting in the scheduling calculation unit 1 using the channel information. However, data to be set is not limited thereto. For example, instead of the channel information, a setting value of a table for converting the radio wave state (e.g., SINR) used by the scheduling calculation unit 1 into the radio throughput, or a setting value, such as of an average throughput of pieces of UE, may be adopted as a target, in some cases.

To represent the channel information as a floating-point number, compression is applied only to the significand, or the channel information is converted into a fixed-point number using the sign bit as well as the significand and exponent and subsequently compression is applied thereto, in some cases.

Operation of First Embodiment

Figure 6:
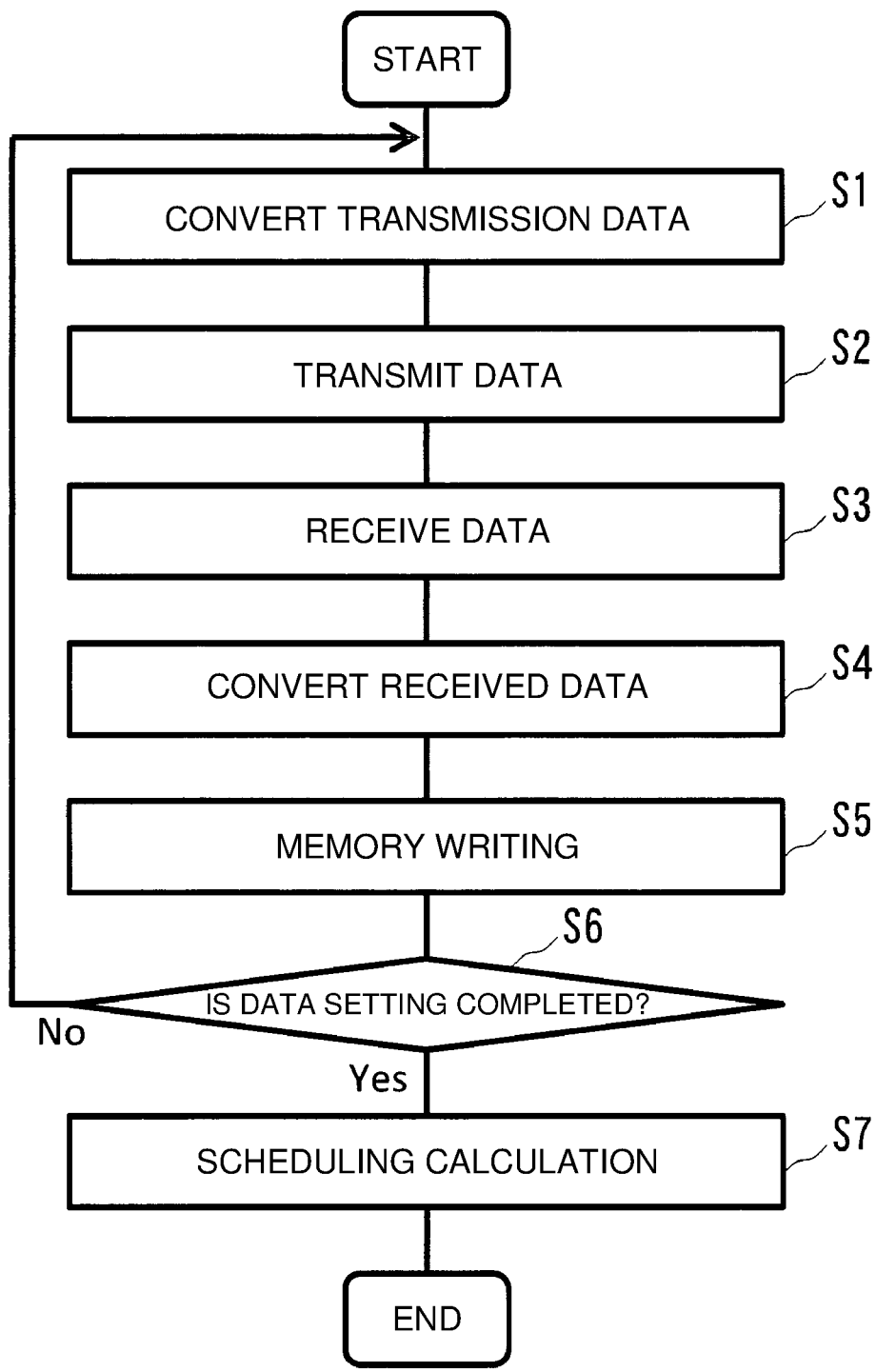
FIG. 6 is a flowchart illustrating operations of the scheduling system according to the first embodiment of the present invention.

Next, referring to FIG. 6, the operation of a scheduling system according to the first embodiment is described. FIG. 6 is a flowchart illustrating operations of the scheduling system according to the first embodiment.

Operation of Transfer Source Process Unit

First, the data conversion unit 21 of the transfer source process unit 2 reads, from the memory 20, the M-bit information DI, such as the channel information, obtained from UE. The data conversion unit 21 of the transfer source process unit 2 converts the M-bit information DI1 by quantizing it to N bits using the conversion table 210 (step S1 in FIG. 6). Here, the conversion table 210 is a conversion table, as shown in FIG. 2, which stores the thresholds TH1, and the N-bit output values DO1 corresponding to the respective thresholds TH1.

For example, in the case of N=4, to quantize the M-bit information DI1 to any one value among 2^4=16 values, a 16-stage conversion table 210 is preliminarily prepared that stores thresholds TH1, and N-bit output values DO1 corresponding to the respective thresholds TH1. The thresholds TH1 are arranged in a descending order or an ascending order. The data conversion unit 21 sequentially compares the M-bit information DI with the thresholds TH1 arranged in the descending order or the ascending order, and outputs, as compressed N-bit information, the N-bit output value DO1 stored in association with the threshold TH1 varying in magnitude relationship with the information DI.

Next, the communication unit 22 of the transfer source process unit 2 converts N-bit information DO1 compressed by the data conversion unit 21 to data in a predetermined format, and transmits the data to the transfer destination process unit 3 according to a predetermined communication scheme (step S2 in FIG. 6). The communication unit 22 converts a set of data items that include the N-bit information DO1 compressed by the data conversion unit 21, and the TPID and UEID corresponding thereto, into data in the predetermined format. In this embodiment, when information DI with TPID=32, UEID=512 and M=32 bits is transmitted to the transfer destination process unit 3, the information DI with M=32 bits is compressed to four-bit information DO1. Accordingly, the number of data items is unchanged, but the entire amount of data to be transmitted can be reduced.

Note that the example described above indicates an example where TPID, UEID and compressed data DO1 are dealt with as one set. However, the data format is not limited thereto. For example, instead of TPID and UEID, the address in a memory 32 of the transfer destination process unit 3 may be added to the information DO1 to identify the destination of the information DO1. If channel information is present in each frequency band (sub-band), information indicating the frequency band, besides TPID and UEID, may be added to the information DO1 in some cases.

Operation of Transfer Destination Process Unit

Next, the communication unit 30 of the transfer destination process unit 3 receives the data transmitted from the transfer source process unit 2 according to the predetermined communication scheme, and passes the N-bit information DO1 included in the received data, to the data conversion unit 31 (step S3 in FIG. 6).

The data conversion unit 31 of the transfer destination process unit 3 expands the N-bit information DO1 input from the communication unit 30, to L bits, using a conversion table 310, as shown in FIG. 4, which stores an input value DO1, and an L-bit output value DO2 corresponding to the input value DO1 (step S4 in FIG. 6). In the case of N=4, the N-bit information DO1 is classified into 2^4=16. Accordingly, a 16-stage conversion table 310 that stores the input value DO1 and the output value DO2 (a significant value used for an actual process in the 16-bit value) is preliminarily prepared.

TPID and UEID included in data received by the communication unit 30, and the L-bit information DO2 converted by the data conversion unit 31 are stored in the memory 32 (step S5 in FIG. 6).

Operation of Scheduling Calculation Unit

At a time when all the setting parameters required by the scheduling calculation unit 1 to start the operation are stored in the memory 32 and the setting is completed (Yes in step S6 in FIG. 6), this unit starts scheduling calculation (step S7 in FIG. 6).

Specifically, the scheduling calculation unit 1 calculates the evaluation values of combination patterns serving as candidates of connection between TPs and UE on the basis of the channel information (DO2), and adopts the optimal combination pattern having the maximum evaluation value, as the combination pattern between TPs and UE to be actually used for transmission. Such operations of the scheduling calculation unit 1 are disclosed in Patent Literature 1, for example. Accordingly, detailed description thereof is omitted.

Advantageous Effects of First Embodiment

As described above, the transfer source process unit 2, which holds the channel information obtained from UE, compresses the channel information to N bits and subsequently transmits the compressed information to the transfer destination process unit 3 that includes the memory 32 accessible from the scheduling calculation unit 1 at high speed. The transfer destination process unit 3 expands, to L bits, the information compressed to N bits on the basis of a predetermined conversion table. At a time when setting of all the setting parameters required to start the operation of the scheduling calculation unit 1 is completed, the scheduling calculation unit 1 starts the scheduling calculation. Accordingly, in this embodiment, the amount of transfer data between the transfer source process unit 2 and the transfer destination process unit 3 can be reduced, in comparison with a case where the channel information is not compressed. In this embodiment, for example, in a case of M=32 and N=4, the amount of transfer data can be reduced to ⅛.

Note that in this embodiment, description has been made using the case where the information is transmitted from the transfer source process unit 2 to the transfer destination process unit 3. However, the information can be read by the transfer destination process unit 3 from the transfer source process unit 2. Such an example is described later.

Configuration of Second Embodiment

Figure 7:
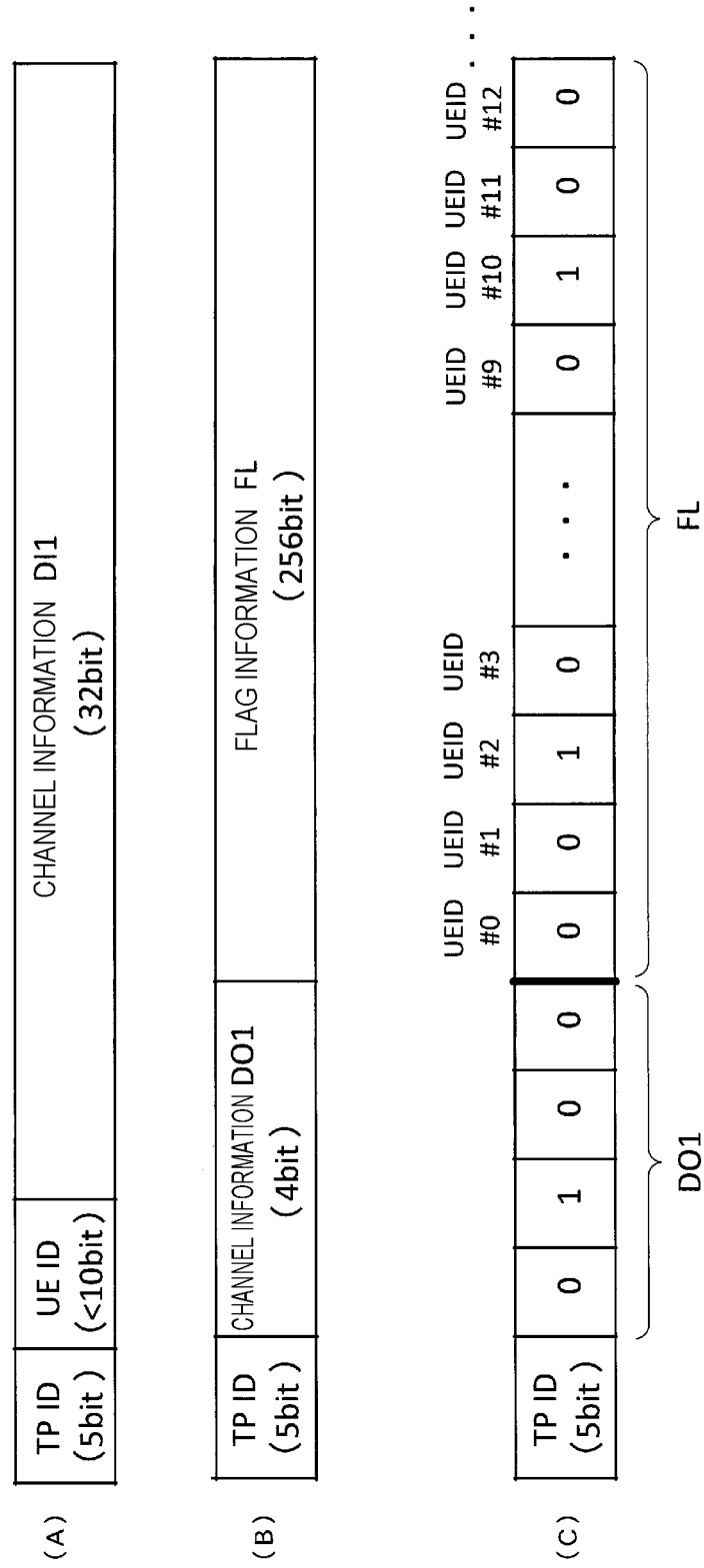
FIG. 7 illustrates a data format used between a transfer source process unit and a transfer destination process unit in a scheduling system according to a second embodiment of the present invention.

Next, a scheduling system according to a second embodiment of the present invention is described. Also in this embodiment, the configuration of the scheduling system is similar to that in the first embodiment. Accordingly, description is made using the symbols in FIG. 1. FIGS. 7(A) to 7(C) illustrate data formats used between a transfer source process unit 2 and a transfer destination process unit 3 in the scheduling system according to this embodiment. Similar to FIG. 3(A), FIG. 7(A) indicates data having not been converted.

The difference from the first embodiment is in the data format used between the transfer source process unit 2 and the transfer destination process unit 3 in the scheduling system. In the first embodiment, the transfer source process unit 2 converts TP-specific channel information on each piece of UE into N-bit information DO1, and transmits the N-bit information DO1, TPID and UEID to the transfer destination process unit 3.

In contrast, the communication unit 22 of this embodiment transmits TPID, N-bit information DO1 (channel information), and flag information FL made up of, for example, 256-bit flags, provided for each piece of UE, to the transfer destination process unit 3 (FIG. 7(B)). If multiple pieces of UE having an identical value of the N-bit information DO1 on one TP are present, the communication unit 22 in this embodiment sets, to "1", each of the bit flags corresponding to the pieces of UE.

For example, in an example in FIG. 7(C), the value of four-bit information DO1 (channel information) compressed by the data conversion unit 21 of the transfer source process unit 2 is "0100".

In the following case, as shown in FIG. 7(C), the communication unit 22 sets, to "1", the bit flags corresponding to UE having UEID #2 and UE having UEID #10. Here, the following case is a case where a value obtained by compressing the channel information obtained from UE having UEID #2 about TP identified by TPID is "0100", and a value obtained by compressing the channel information obtained from UE having UEID #10 about TP identified by TPID is "0100".

Note that the example described above indicates an example of transmission with respect to each value of the channel information. However, the channel information on not all the setting targets is required to be necessarily transmitted. For example, if there is no corresponding UEID in the channel information, transmission is not necessarily performed.

It is determined whether to perform data compression or not according to the number of pieces of UE, in some cases. For example, if the number of pieces of UE is small, a small number of data transmissions are sufficient. Accordingly, the first embodiment is more preferably used than this embodiment. In contrast, if the number of pieces of UE is large, the method of the first embodiment, which transmits the channel information on a TP-by-TP basis and a UE-by-UE basis, increases the number of data transmissions accordingly. Consequently, this embodiment is more preferably used.

In a case where there are multiple pieces of UE having the identical channel information about TP identified by TPID, the communication unit 22 of the transfer source process unit 2 in this embodiment does not separately transmit the channel information on these pieces of UE but transmits the information at one time.

In the case of this embodiment, TPID and the flag information FL included in the data received by the communication unit 30 of the transfer destination process unit 3, and the L-bit information DO2 received by the communication unit 30 and converted by the data conversion unit 31, are stored in the memory 32.

The scheduling calculation unit 1 of this embodiment recognizes the L-bit information DO2 stored in the memory 32, as channel information on UE where TP identified by TPID and the bit flags are set.

Advantageous Effects of Second Embodiment

As described above, if multiple pieces of UE having the same value of the N-bit information DO1 on one TP are present, the transfer source process unit 2 in this embodiment adds the flag information FL where the bit flags corresponding to the respective pieces of UE are set, to the N-bit information DO1. Accordingly, in this embodiment, one data transmission can transmit multiple combinations between TPs and pieces of UE corresponding to the identical channel information. In this embodiment, the amount of transfer data between the transfer source process unit 2 and the transfer destination process unit 3 can be reduced, in comparison with a case where the channel information is not compressed.

Figure 8:
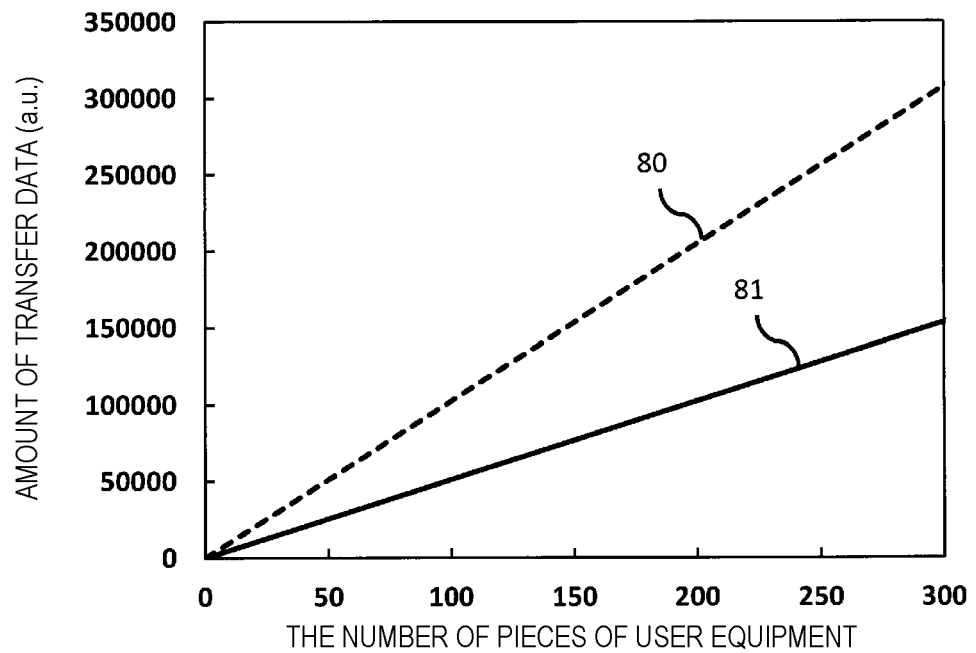
FIG. 8 shows advantageous effects of the scheduling system according to the second embodiment of the present invention.

FIG. 8 shows advantageous effects of the scheduling system according to this embodiment. Reference numeral 80 in FIG. 8 denotes the amount of transfer data in a case without data compression. Reference numeral 81 denotes the amount of transfer data in the case of this embodiment. In this embodiment, for example, a case of M=32 and N=4 can reduce the amount of transfer data to about ½, in comparison with a case where the channel information is not compressed.

Configuration of Third Embodiment

Next, a scheduling system according to a third embodiment of the present invention is described. Also in this embodiment, the configuration of the scheduling system is similar to that in the first embodiment. Accordingly, description is made using the symbols in FIG. 1. FIGS. 9(A) to 9(D) illustrate data formats used between the transfer source process unit 2 and the transfer destination process unit 3 in the scheduling system according to this embodiment. Similar to FIG. 3(A), FIG. 9(A) indicates data having not been converted.

The difference from the first and second embodiments is in the data format used between the transfer source process unit 2 and the transfer destination process unit 3 in the scheduling system. In the first embodiment, the transfer source process unit 2 converts TP-specific channel information on each piece of UE into N-bit information DO1, and transmits this information DO1 (channel information), TPID and UEID to the transfer destination process unit 3.

Figure 9:
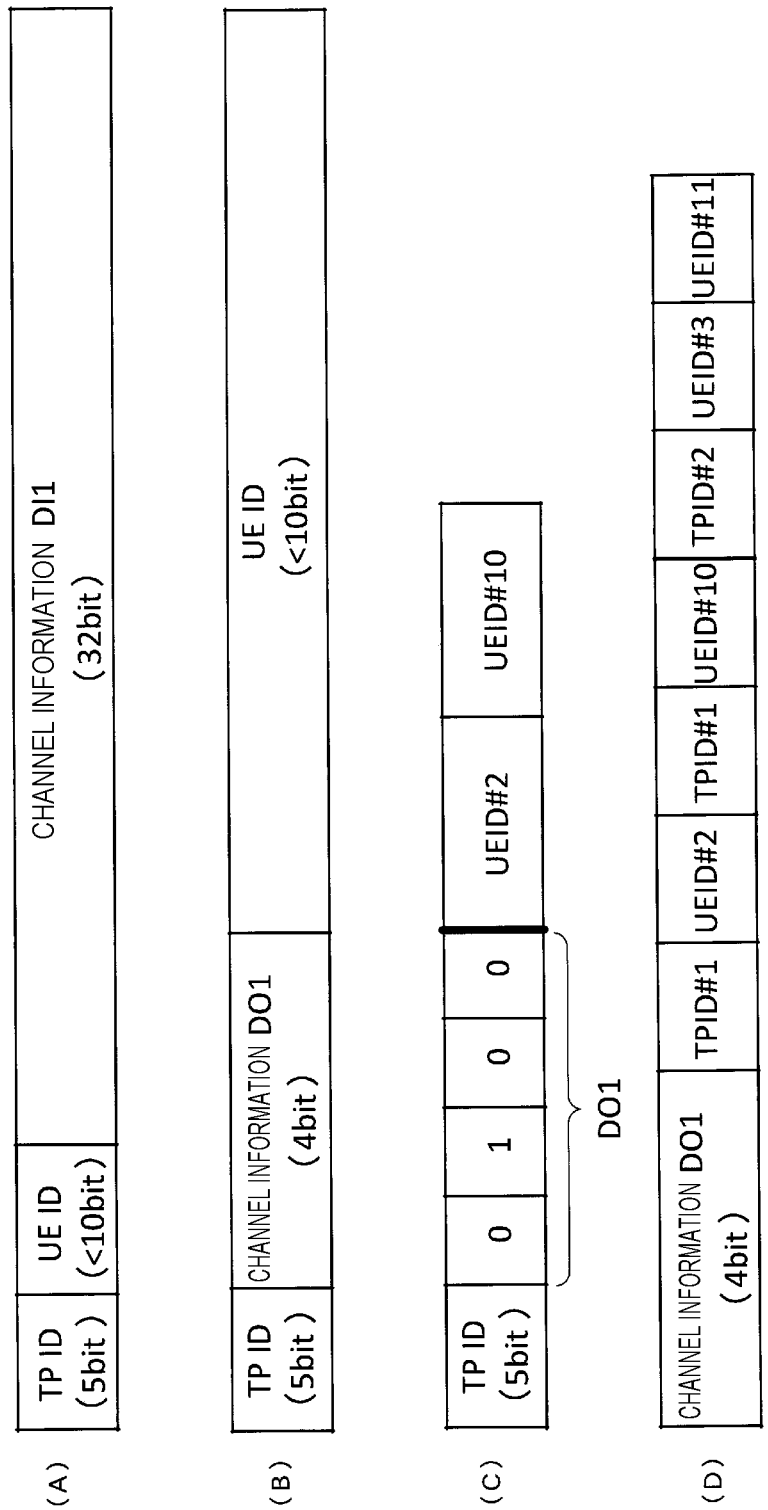
FIG. 9 illustrates a data format used between a transfer source process unit and a transfer destination process unit in a scheduling system according to a third embodiment of the present invention.

Meanwhile, in this embodiment, similar to the first embodiment, the N-bit information DO1, TPID and UEID are transmitted to the transfer destination process unit 3 (FIG. 9(B)). Note that if multiple pieces of UE having the identical value of the N-bit information DO1 on one TP are present, the communication unit 22 of the transfer source process unit 2 of this embodiment adds IDs of these pieces of UE to the N-bit information DO1. Accordingly, the data format is a variable-length one.

For example, in an example in FIG. 9(C), the value of four-bit information DO1 (channel information) compressed by the data conversion unit 21 of the transfer source process unit 2 is "0100". In the following case, as shown in FIG. 9(C), the communication unit 22 adds UEID #2 and UEID #10 to the N-bit information DO1, and transmits the information. Here, the following case is a case where a value obtained by compressing the channel information obtained from UE having UEID #2 about TP identified by TPID is "0100", and a value obtained by compressing the channel information obtained from UE having UEID #10 about TP identified by TPID is "0100".

Note that the example described above indicates an example of transmission with respect to each value of the channel information. However, the channel information on not all the setting targets is required to be necessarily transmitted. For example, if there is no corresponding UEID in the channel information, transmission is not necessarily performed.

It is determined whether to perform data compression or not according to the number of pieces of UE, in some cases. For example, if the number of pieces of UE is small, a small number of data transmissions are sufficient. Accordingly, the first embodiment is more preferably used than this embodiment. In contrast, if the number of pieces of UE is large, the method of the first embodiment, which transmits the channel information on a TP-by-TP basis and a UE-by-UE basis, increases the number of data transmissions accordingly. Consequently, this embodiment is more preferably used.

In a case where there are multiple pieces of UE having the identical channel information about TP identified by TPID, the communication unit 22 of the transfer source process unit 2 in this embodiment does not separately transmit the UEID on these pieces of UE but transmits the information at one time.

In the case of this embodiment, TPID and one or more UEIDs included in the data received by the communication unit 30 of the transfer destination process unit 3, and the L-bit information DO2 received by the communication unit 30 and converted by the data conversion unit 31, are stored in the memory 32.

The scheduling calculation unit 1 of this embodiment recognizes the L-bit information DO2 stored in the memory 32, as channel information on UE where TP identified by TPID and one or more UEIDs are identified.

In a case where there are multiple combinations of TPs and pieces of UE corresponding to the identical value of the N-bit information DO1, the communication unit 22 may add the combination of TPID and UEID about each of the combinations, to the N-bit information DO1 (FIG. 9(D)). For example, in the following case, as shown in FIG. 9(D), the communication unit 22 adds the combination of TPID #1 and UEID #2, and the combination of TPID #1 and UEID #10 to the N-bit information DO1, and transmits the information. Here, the following case is a case where the combination of TP having TPID #1 and UE having UEID #2, and the combination of TP having TPID #1 and UE having UEID #10 are present as the combinations of TPs and pieces of UE corresponding to the identical channel information.

Furthermore, an example in FIG. 9(C) and an example in FIG. 9(D) may be combined. In the example in FIG. 9(D), for example, in the following case, as shown in FIG. 9(D), the communication unit 22 adds the combination of TPID #1 and UEID #2, the combination of TPID #1 and UEID #10, and the combination of TPID #2 and UEID #3 and #11, to the N-bit information DO1, and transmits the information. Here, the following case is a case where the combination of TP having TPID #1 and UE having UEID #2, the combination of TP having TPID #1 and UE having UEID #10, and the combination of TP having TPID #2 and UE having UEID #3 and #11 are present as the combinations of TPs and pieces of UE corresponding to the identical channel information.

Advantageous Effects of Third Embodiment

As described above, if multiple pieces of UE having the identical value of the N-bit information DO1 on one TP are present, the transfer source process unit 2 of this embodiment transmits IDs of these pieces of UE together with the N-bit information DO1, to the transfer destination process unit 3. Accordingly, in this embodiment, the data format is a variable-length one. Consequently, even if the number of combinations between TPs and pieces of UE corresponding to the identical channel information temporarily increases, the channel information can be transmitted at one time.

Configuration of Fourth Embodiment

Figure 10:
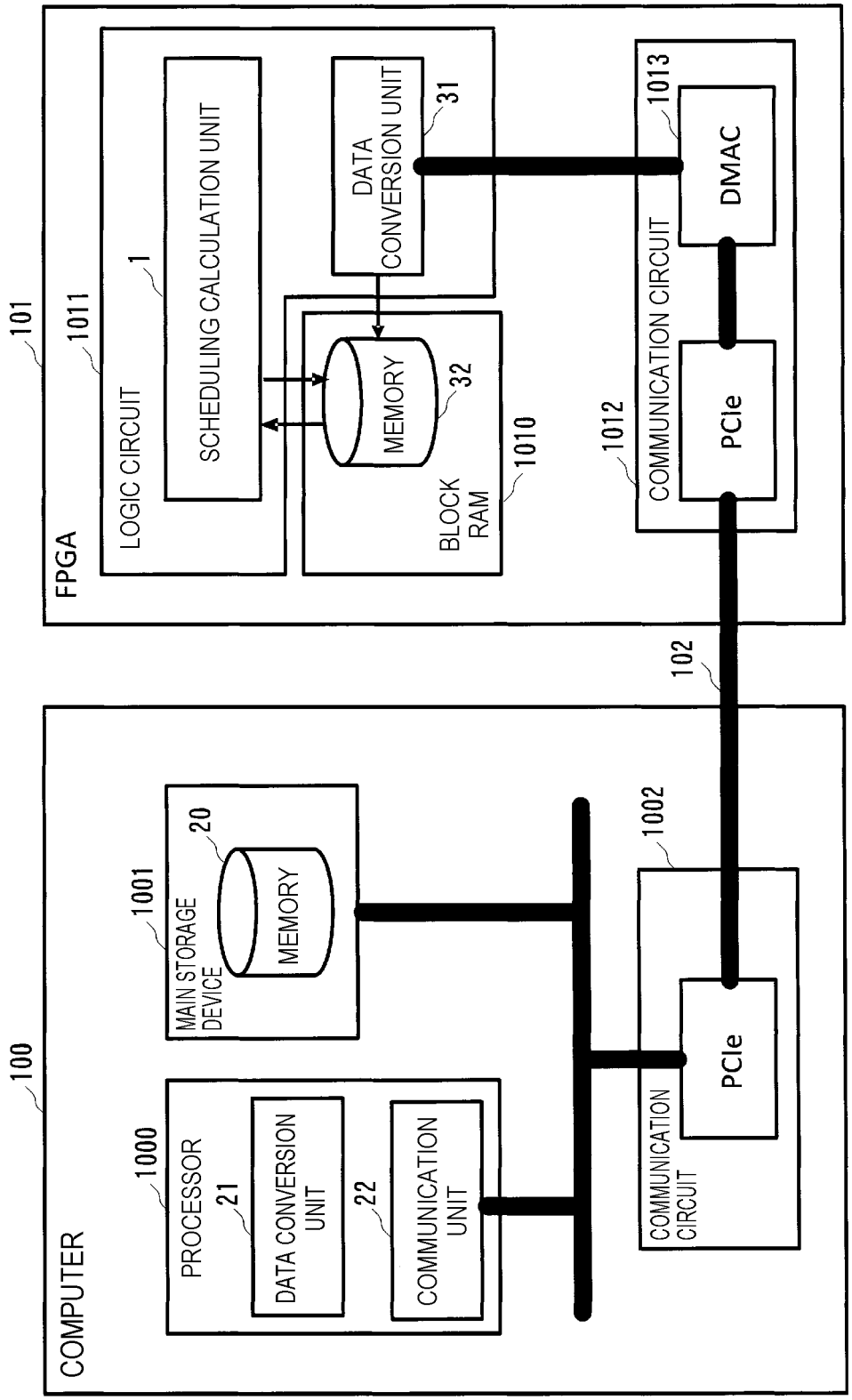
FIG. 10 is a block diagram showing a configuration of a scheduling system according to a fourth embodiment of the present invention.

Next, a scheduling system according to a fourth embodiment of the present invention is described. FIG. 10 is a block diagram showing the configuration of the scheduling system according to the fourth embodiment. The difference from the first to third embodiments is in that the scheduling system of the first to third embodiments is configured using a computer 100 (e.g., a general-purpose server) of a base station apparatus that performs processes based mainly on software, and an FPGA 101 that performs processes based mainly on hardware.

The transfer source process unit 2 of the scheduling system is implemented in the computer 100 of the base station apparatus. The scheduling calculation unit 1 and the transfer destination process unit 3 of the scheduling system are implemented in the FPGA 101. The computer 100 and the FPGA 101 are connected to each other by a data bus or a communication line 102.

The computer 100 includes a processor 1000, a main storage device 1001, and a communication circuit 1002. The memory 20 of the transfer source process unit 2 is achieved by the main storage device 1001. The data conversion unit 21 of the transfer source process unit 2 is achieved by the processor 1000. The communication unit 22 of the transfer source process unit 2 is achieved by the processor 1000 and the communication circuit 1002. The processor 1000 performs processes according to a program stored in the main storage device 1001, and functions as the data conversion unit 21 and the communication unit 22.

The communication scheme of the communication circuit 1002 may be PCIe and Ethernet as described above.

The FPGA 101 includes a block RAM 1010, a logic circuit 1011, and a communication circuit 1012.

The memory 32 of the transfer destination process unit 3 is achieved by registers made up of the block RAM 1010. The scheduling calculation unit 1 and the data conversion unit 31 of the transfer destination process unit 3 are achieved by the logic circuit loll. The communication unit 30 of the transfer destination process unit 3 is achieved by the communication circuit 1012.

Register access of the FPGA 101 improves the rate of data transfer using a DMAC (Direct Memory Access Controller) 1013 in the FPGA 101. Use of the DMAC 1013 allows data transfer between the computer 100 (transfer source process unit 2) and the FPGA 101 (transfer destination process unit 3) without intervention of the processor 1000.

In this case, the processor 1000, which functions as the data conversion unit 21 and the communication unit 22, compresses the M-bit information DI1 (channel information) before data transfer, and stores the compressed N-bit information DO1, TPID and UEID, in the main storage device 1001 (first and third embodiments). Alternatively, the processor 1000 stores the N-bit information DO1 and the flag information FL, in the main storage device 1001 (second embodiment).

As described above, the DMAC 1013 of the FPGA 101 can read the N-bit information DO1, TPID and UEID, or the N-bit information DO1 and the flag information FL, from the main storage device 1001 of the computer 100, and pass the information to the logic circuit 1011. According to such a configuration, the process by the processor 1000 does not intervene, during DMA transfer by the DMAC 1013.

Advantageous Effects of Fourth Embodiment

As described above, in this embodiment, in a case of implementing the scheduling calculation unit 1 in the FPGA 101, the transfer source process unit 2 is implemented in the computer 100 that sets desired data in the FPGA 101, and the transfer destination process unit 3 is implemented in the FPGA 101. Accordingly, in comparison with a case where the channel information is not compressed, the amount of transfer data between the transfer source process unit 2 and the transfer destination process unit 3 can be reduced, which can in turn reduce the data transfer time period, and improve the speed of identifying the optimal transmission combination between TP and UE by the scheduling calculation unit 1.

Figure 11:
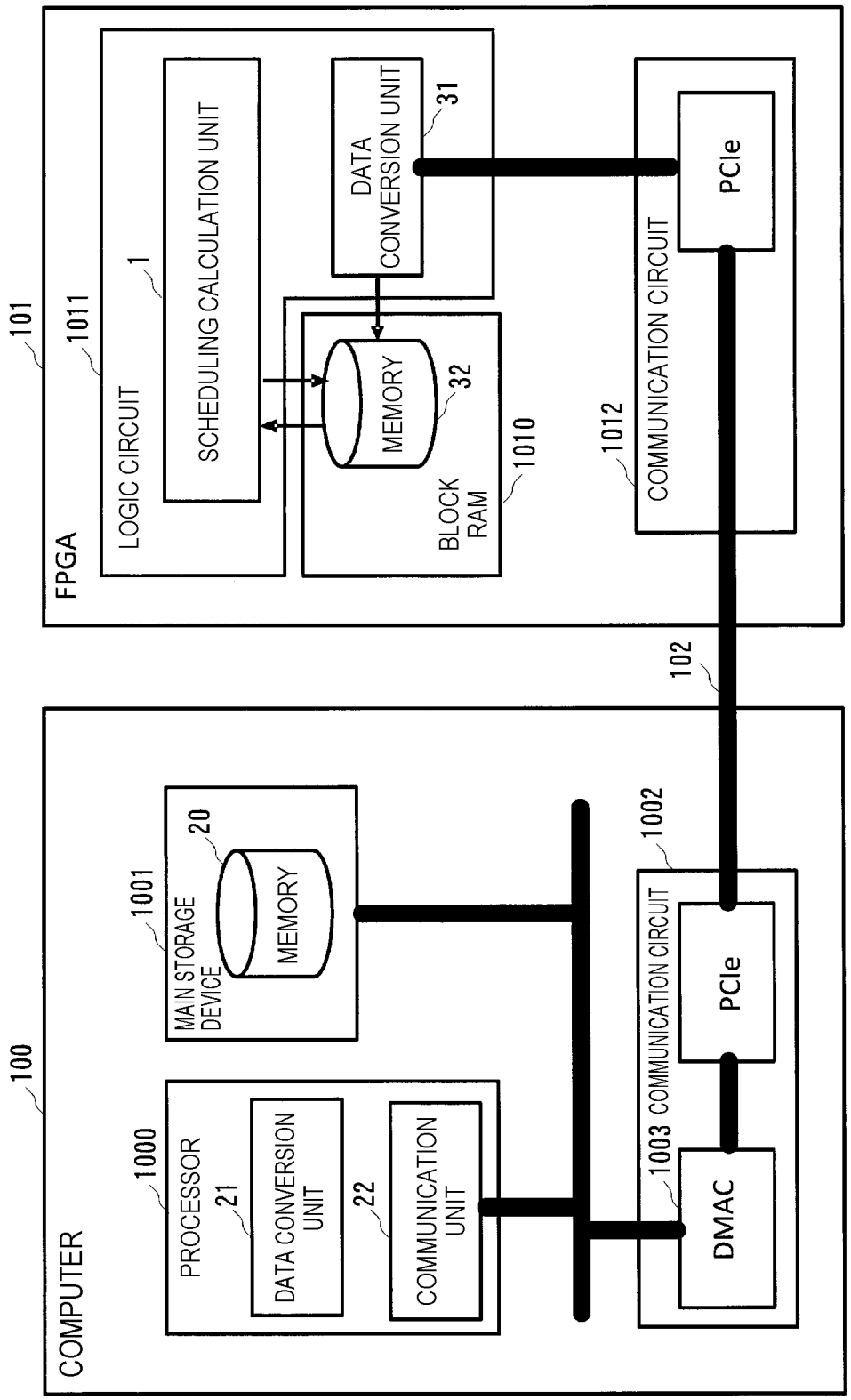
FIG. 11 is a block diagram showing another configuration of a scheduling system according to the fourth embodiment of the present invention.
Figure 12:
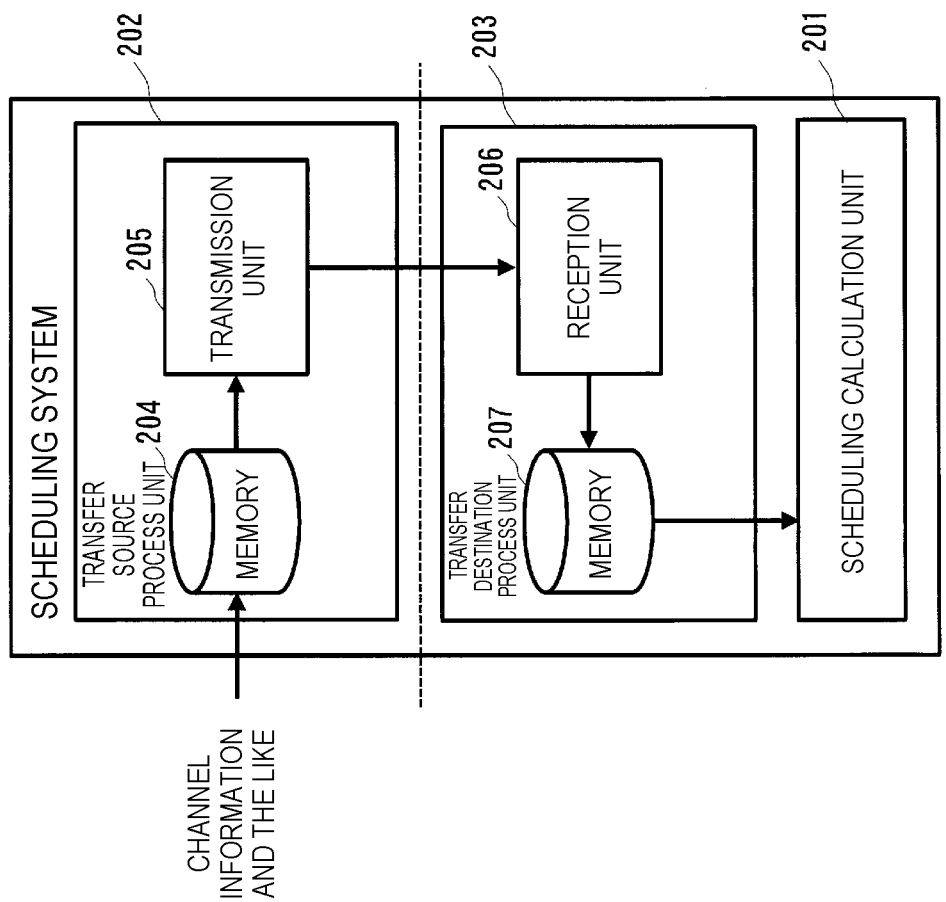
FIG. 12 is a block diagram showing a configuration of a conventional scheduling system.

Note that in the example in FIG. 10, description is made using the example where the DMAC 1013 is provided in the FPGA 101, and the FPGA 101 (transfer destination process unit 3) reads data from the computer 100 (transfer source process unit 2). Alternatively, DMAC may be provided in the computer 100. FIG. 11 shows the configuration in this case. In the example in FIG. 11, the DMAC 1003 provided in the computer 100 can read the N-bit information DO1, TPID and UEID, or the N-bit information DO1 and the flag information FL, from the main storage device 1001 of the computer 100, and transfer (transmit) the read items to the FPGA 101.

Extension of Embodiments

The present invention has thus been described above with reference to the embodiments. However, the present invention is not limited to the aforementioned embodiments. The configuration and details of the present invention can be variously changed in a manner understandable by those skilled in the art within the scope of the present invention. The embodiments may be freely combined and implemented within a range without contradiction.

INDUSTRIAL APPLICABILITY

Embodiments of the present invention are applicable to scheduling technologies of allocating radio resources that wireless networks have.

REFERENCE SIGNS LIST

1 Scheduling calculation unit
2 Transfer source process unit
3 Transfer destination process unit
20, 32 Memory
21, 31 Data conversion unit
22, 30 Communication unit
100 Computer
101 FPGA
102 Data bus or communication line
210, 310 Conversion table
1000 Processor
1001 Main storage device
1002 Communication circuit
1003, 1013 DMAC
1010 Block RAM
1011 Logic circuit
1012 Communication circuit.

The invention claimed is:

1. A scheduling system allocating a radio resource held by a plurality of transmission points for radio communications between the transmission points and user equipment in a wireless network system including the transmission points, the scheduling system comprising:
a transfer source processor configured to compress M-bit information obtained from the user equipment to N bits and obtain N-bit information, wherein M is an integer of two or more, N<M, and N is an integer of one or more, wherein the user equipment is separate from the scheduling system;
a transfer destination processor configured to expand the N-bit information transmitted from the transfer source processor or read from the transfer source processor to L bits and obtain L-bit expanded information and store the L-bit expanded information, wherein L>N and L is an integer of two or more; and
a scheduling calculator configured to identify an optimal combination pattern between the transmission points and the user equipment according to the L-bit expanded information stored in the transfer destination processor.

2. The scheduling system according to claim 1, wherein: the transfer source processor is configured to add an ID of a first user equipment to the N-bit information, wherein the N-bit information corresponds to a first transmission point and the first user equipment.

3. The scheduling system according to claim 1, wherein when a plurality of user equipment having an identical value of N-bit information on a first transmission point are present, identification information corresponding to the plurality of user equipment is added to the N-bit information.

4. The scheduling system according to claim 3, wherein the identification information corresponding to the plurality of user equipment is IDs of the plurality of user equipment.

5. The scheduling system according to claim 3, wherein the identification information corresponding to the plurality of user equipment is flag information where bit flags corresponding to the plurality of user equipment are set.

6. The scheduling system according to claim 1, wherein when there are a plurality of combinations between the transmission points and a plurality of user equipment corresponding to an identical value of N-bit information, the transfer source processor adds first IDs of the transmission points and second IDs of the plurality of user equipment, to the N-bit information for each of the plurality of combinations.

7. The scheduling system according to claim 1, wherein the transfer source processor is implemented in a computer, and wherein the transfer destination processor and the scheduling calculator are implemented in an FPGA connected to the computer.

8. The scheduling system according to claim 1, wherein the M-bit information obtained from the user equipment is channel information representing a radio wave state.

9. A scheduling method allocating a radio resource held by a plurality of transmission points to radio communication between the transmission points and user equipment in a wireless network system including the transmission points, the scheduling method comprising:
a first step of a transfer source processor of a scheduling system compressing M-bit information obtained from the user equipment to N bits and obtain N-bit information, wherein M is an integer of two or more, N<M, and N is an integer of one or more, wherein the user equipment is separate from the scheduling system;
a second step of a transfer destination processor of the scheduling system expanding the N-bit information transmitted from the transfer source processor or read from the transfer source processor to L bits and obtain L-bit expanded information, wherein L>N and L is an integer of two or more;
a third step of the transfer destination processor storing the L-bit expanded information; and
a fourth step of a scheduling calculator configured to identify an optimal combination pattern between the transmission points and the user equipment according to the L-bit expanded information stored in the transfer destination processor.

10. The scheduling method according to claim 9, wherein: in the first step, the transfer source processor adds an ID of a first user equipment to the N-bit information, wherein the N-bit information corresponds to a first transmission point and the first user equipment.

11. The scheduling method according to claim 9, wherein:
in the first step, when a plurality of user equipment having an identical value of N-bit information on a first transmission point are present, identification information corresponding to the plurality of user equipment is added to the N-bit information.

12. The scheduling method according to claim 11, wherein the identification information corresponding to the plurality of user equipment is flag information where bit flags corresponding to the plurality of user equipment are set.

13. The scheduling method according to claim 11, wherein the identification information corresponding to the plurality of user equipment is IDs of the plurality of user equipment.

* * * * *